United States Patent
Cao et al.

(10) Patent No.: US 10,797,098 B2
(45) Date of Patent: *Oct. 6, 2020

(54) IMAGE SENSOR BASED ON AVALANCHE PHOTODIODES

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/529,909

(22) Filed: Aug. 2, 2019

(65) Prior Publication Data

US 2019/0355777 A1    Nov. 21, 2019

Related U.S. Application Data

(63) Continuation of application No. 16/117,966, filed on Aug. 30, 2018, now Pat. No. 10,418,409, which is a
(Continued)

(51) Int. Cl.
*H01L 21/00* (2006.01)
*H01L 27/146* (2006.01)
(Continued)

(52) U.S. Cl.
CPC .. *H01L 27/14643* (2013.01); *H01L 27/14603* (2013.01); *H01L 27/14609* (2013.01); *H01L 31/107* (2013.01); *G02B 21/361* (2013.01)

(58) Field of Classification Search
CPC ......... H01L 27/14643; H01L 27/14603; H01L 27/14609; H01L 31/107; G02B 21/361
See application file for complete search history.

(56) References Cited

U.S. PATENT DOCUMENTS 5,596,186 A      1/1997  Kobayashi
10,418,409 B2 *  9/2019  Cao ................. H01L 31/107
(Continued)

FOREIGN PATENT DOCUMENTS

| WO | 03003476 A2 | 1/2003 |
| WO | 2009103048 A1 | 8/2009 |
| WO | 2012032353 A2 | 3/2012 |

OTHER PUBLICATIONS

Kanbe H et al:GE/SI Heterojunction Photodiodes Fabricated by Wafer Bonding, Japanese Journal of Applied Physics, Japan Society of Applied Physics, vol. 45, No. 25, Jun. 23, 2006 (Jun. 23, 2006), pp. L644-L646, XP001502529, ISSN: 0021-4922, DOI: 10.1143/JJAP.45.L644.

*Primary Examiner* — Richard A Booth
(74) *Attorney, Agent, or Firm* — IPro, PLLC

(57) ABSTRACT

Disclosed herein is an apparatus comprising: an array of avalanche photodiodes (APDs), each of the APDs comprising an absorption region and an amplification region; wherein the absorption region is configured to generate charge carriers from a photon absorbed by the absorption region; wherein the amplification region comprises a junction with an electric field in the junction; wherein the electric field is at a value sufficient to cause an avalanche of charge carriers entering the amplification region, but not sufficient to make the avalanche self-sustaining; wherein the junctions of the APDs are discrete.

25 Claims, 16 Drawing Sheets

Related U.S. Application Data continuation of application No. PCT/CN2016/086513, filed on Jun. 21, 2016.

(51) Int. Cl.
*H01L 31/107* (2006.01)
*G02B 21/36* (2006.01)

(56) References Cited

U.S. PATENT DOCUMENTS

2006/0289957 A1 12/2006 Morse et al.
2015/0054111 A1 2/2015 Niclass et al.

\* cited by examiner

US 10,797,098 B2

IMAGE SENSOR BASED ON AVALANCHE PHOTODIODES

TECHNICAL FIELD

The disclosure herein relates to an image sensor, particularly relates an image sensor based on avalanche diodes.

BACKGROUND

An image sensor or imaging sensor is a sensor that can detect a spatial intensity distribution of a radiation. An image sensor usually represents the detected image by electrical signals. Image sensors based on semiconductor devices may be classified into several types, including semiconductor charge-coupled devices (CCD), complementary metal-oxide-semiconductor (CMOS), N-type metal-oxide-semiconductor (NMOS). A CMOS image sensor is a type of active pixel sensor made using the CMOS semiconductor process. Light incident on a pixel in the CMOS image sensor is converted into an electric voltage. The electric voltage is digitized into a discrete value that represents the intensity of the light incident on that pixel. An active-pixel sensor (APS) is an image sensor that includes pixels with a photodetector and an active amplifier. A CCD image sensor includes a capacitor in a pixel. When light incidents on the pixel, the light generates electrical charges and the charges are stored on the capacitor. The stored charges are converted to an electric voltage and the electrical voltage is digitized into a discrete value that represents the intensity of the light incident on that pixel.

SUMMARY

Disclosed herein is an apparatus comprising: an array of avalanche photodiodes (APDs), each of the APDs comprising an absorption region and an amplification region; wherein the absorption region is configured to generate charge carriers from a photon absorbed by the absorption region; wherein the amplification region comprises a junction with an electric field in the junction; wherein the electric field is at a value sufficient to cause an avalanche of charge carriers entering the amplification region, but not sufficient to make the avalanche self-sustaining; wherein the junctions of the APDs are discrete.

According to an embodiment, the photon is a soft X-ray photon.

According to an embodiment, the absorption region has an absorptance of at least 80% for soft X-ray.

According to an embodiment, the absorption region has a thickness of 10 microns or above.

According to an embodiment, the absorption region comprises silicon.

According to an embodiment, an electric field in the absorption region is not high enough to cause avalanche effect in the absorption region.

According to an embodiment, the absorption region is an intrinsic semiconductor or a semiconductor with a doping level less than $10^{12}$ dopants/cm$^3$.

According to an embodiment, the absorption regions of at least some of the APDs are joined together.

According to an embodiment, the apparatus comprises two amplification regions on opposite sides of the absorption region.

According to an embodiment, the amplification regions of the APDs are discrete.

According to an embodiment, the junction is a p-n junction or a heterojunction.

According to an embodiment, the junction comprises a first layer and a second layer, wherein the first layer is a doped semiconductor and the second layer is a heavily doped semiconductor.

According to an embodiment, the first layer has a doping level of $10^{13}$ to $10^{17}$ dopants/cm$^3$.

According to an embodiment, the first layers of least some of the APDs are joined together.

According to an embodiment, the apparatus further comprises electrodes respectively in electrical contact with the second layers of the APDs.

According to an embodiment, the apparatus further comprises a passivation material configured to passivate a surface of the absorption region.

According to an embodiment, the apparatus further comprises a common electrode electrically connected to the absorption region.

According to an embodiment, the junction is separated from a junction of a neighbor junction by a material of the absorption region, a material of the first or second layer, an insulator material, or a guard ring of a doped semiconductor.

According to an embodiment, the guard ring is a doped semiconductor of a same doping type as the second layer and the guard ring is not heavily doped.

According to an embodiment, the junction further comprises a third layer sandwiched between the first and second layers; wherein the third layer comprises an intrinsic semiconductor.

According to an embodiment, the third layers of at least some of the APDs are joined together.

Disclosed herein is a system comprising any of the above apparatuses and an X-ray source, wherein the system is configured such that the apparatus forms an image of an object using X-ray from the X-ray source that penetrated the object.

According to an embodiment, the system is configured to conduct chest X-ray radiography, abdominal X-ray radiography, dental X-ray radiography, or mammography.

According to an embodiment, the system is configured to conduct computation computed tomography.

According to an embodiment, the system is a microscope.

DETAILED DESCRIPTION

An avalanche photodiode (APD) is a photodiode that uses the avalanche effect to generate an electric current upon exposure to light. The avalanche effect is a process where free charge carriers in a material are subjected to strong acceleration by an electric field and subsequently collide with other atoms of the material, thereby ionizing them (impact ionization) and releasing additional charge carriers which accelerate and collide with further atoms, releasing more charge carriers—a chain reaction. Impact ionization is a process in a material by which one energetic charge carrier can lose energy by the creation of other charge carriers. For example, in semiconductors, an electron (or hole) with enough kinetic energy can knock a bound electron out of its bound state (in the valence band) and promote it to a state in the conduction band, creating an electron-hole pair.

An APD may work in the Geiger mode or the linear mode. When the APD works in the Geiger mode, it may be called a single-photon avalanche diode (SPAD) (also known as a Geiger-mode APD or G-APD). A SPAD is an APD working under a reverse bias above the breakdown voltage. Here the word "above" means that absolute value of the reverse bias is greater than the absolute value of the breakdown voltage. A SPAD may be used to detect low intensity light (e.g., down to a single photon) and to signal the arrival times of the photons with a jitter of a few tens of picoseconds. A SPAD may be in a form of a p-n junction under a reverse bias (i.e., the p-type region of the p-n junction is biased at a lower electric potential than the n-type region) above the breakdown voltage of the p-n junction. The breakdown voltage of a p-n junction is a reverse bias, above which exponential increase in the electric current in the p-n junction occurs. An APD working at a reverse bias below the breakdown voltage is operating in the linear mode because the electric current in the APD is proportional to the intensity of the light incident on the APD.

Figure 1:
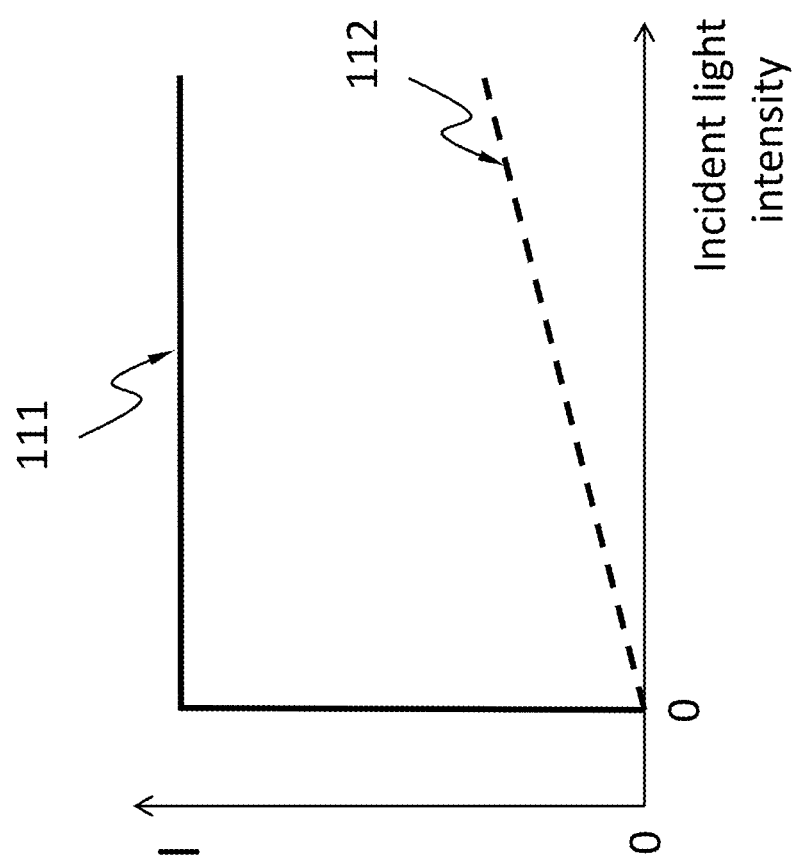
FIG. 1 schematically shows the electric current in an APD as a function of the intensity of light incident on the APD when the APD is in the linear mode, and a function of the intensity of light incident on the APD when the APD is in the Geiger mode.

FIG. 1 schematically shows the electric current in an APD as a function 112 of the intensity of light incident on the APD when the APD is in the linear mode, and a function 111 of the intensity of light incident on the APD when the APD is in the Geiger mode (i.e., when the APD is a SPAD). In the Geiger mode, the current shows a very sharp increase with the intensity of the light and then saturation. In the linear mode, the current is essentially proportional to the intensity of the light.

Figure 2C:
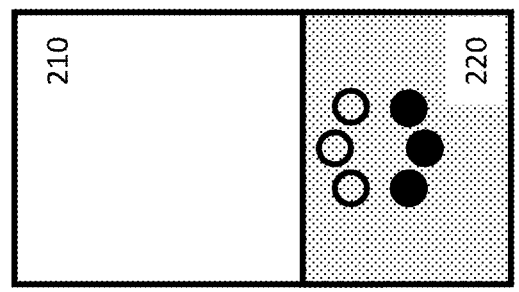
FIG. 2A, FIG. 2B and FIG. 2C schematically show the operation of an APD, according to an embodiment.
Figure 2B:
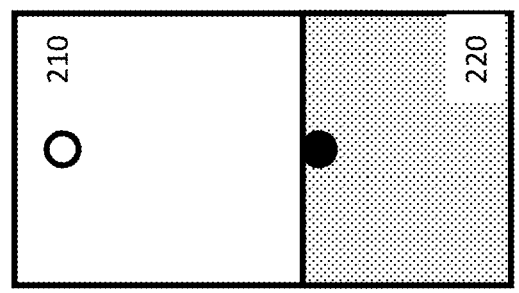
Figure 2A:
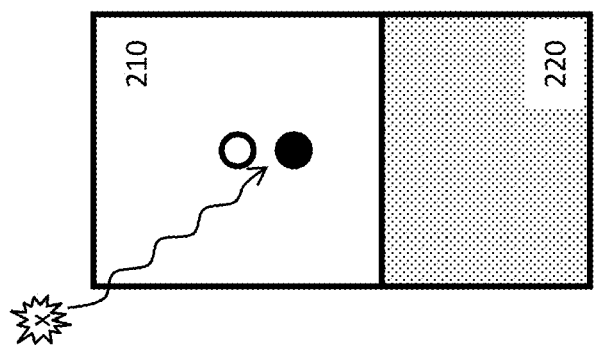

FIG. 2A, FIG. 2B and FIG. 2C schematically show the operation of an APD, according to an embodiment. FIG. 2A shows that when a photon (e.g., an X-ray photon) is absorbed by an absorption region 210, multiple (100 to 10000 for an X-ray photon) electron-hole pairs maybe generated. The absorption region 210 has a sufficient thickness and thus a sufficient absorptance (e.g., >80% or >90%) for the incident photon. For soft X-ray photons, the absorption region 210 may be a silicon layer with a thickness of 10 microns or above. The electric field in the absorption region 210 is not high enough to cause avalanche effect in the absorption region 210. FIG. 2B shows that the electrons and hole drift in opposite directions in the absorption region 210. FIG. 2C shows that avalanche effect occurs in an amplification region 220 when the electrons (or the holes) enter that amplification region 220, thereby generating more electrons and holes. The electric field in the amplification region 220 is high enough to cause an avalanche of charge carriers entering the amplification region 220 but not too high to make the avalanche effect self-sustaining. A self-sustaining avalanche is an avalanche that persists after the external triggers disappear, such as photons incident on the APD or charge carriers drifted into the APD. The electric field in the amplification region 220 may be a result of a doping profile in the amplification region 220. For example, the amplification region 220 may include a p-n junction or a heterojunction that has an electric field in its depletion zone. The threshold electric field for the avalanche effect (i.e., the electric field above which the avalanche effect occurs and below which the avalanche effect does not occur) is a property of the material of the amplification region 220. The amplification region 220 may be on one or two opposite sides of the absorption region 210.

Figure 3A:
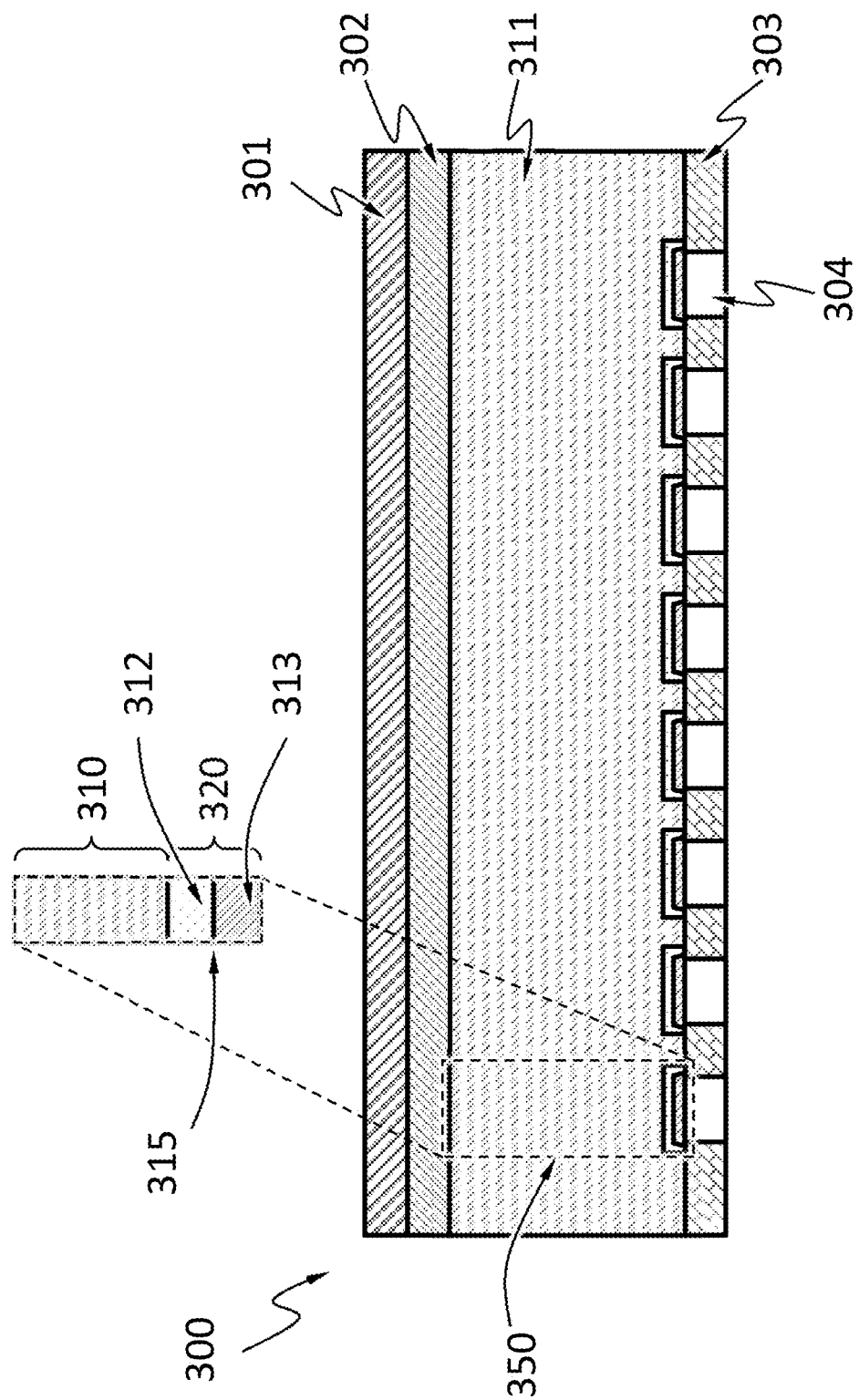
FIG. 3A schematically shows a cross section of an image sensor based on an array of APDs.

FIG. 3A schematically shows a cross section of an image sensor 300 based on an array of APDs 350. Each of the APDs 350 may have an absorption region 310 and an amplification region 320 as the example shown in FIG. 2A, FIG. 2B and FIG. 2C. At least some, or all, of the APDs 350 in the image sensor 300 may have their absorption regions 310 joined together. Namely, the image sensor 300 may have joined absorption regions 310 in a form of an absorption layer 311 that is shared among at least some or all of the APDs 350. The amplification regions 320 of the APDs 350 are discrete regions. Namely the amplification regions 320 of the APDs 350 are not joined together. In an embodiment, the absorption layer 311 may be in form of a semiconductor wafer such as a silicon wafer. The absorption regions 310 may be an intrinsic semiconductor or very lightly doped semiconductor (e.g., $<10^{12}$ dopants/cm$^3$, $<10^{11}$ dopants/cm$^3$, $<10^{10}$ dopants/cm$^3$, $<10^9$ dopants/cm$^3$), with a sufficient thickness and thus a sufficient absorptance (e.g., >80% or >90%) for incident photons of interest (e.g., X-ray photons). The amplification regions 320 may have a junction 315 formed by at least two layers 312 and 313. The junction 315 may be a heterojunction of a p-n junction. In an embodiment, the layer 312 is a p-type semiconductor (e.g., silicon) and the layer 313 is a heavily doped n-type layer (e.g., silicon). The phrase "heavily doped" is not a term of degree. A heavily doped semiconductor has its electrical conductivity comparable to metals and exhibits essentially linear positive thermal coefficient. In a heavily doped semiconductor, the dopant energy levels are merged into an energy band. A heavily doped semiconductor is also called degenerate semiconductor. The layer 312 may have a doping level of $10^{13}$ to $10^{17}$ dopants/cm$^3$. The layer 313 may have a doping level of $10^{18}$ dopants/cm$^3$ or above. The layers 312 and 313 may be formed by epitaxy growth, dopant implantation or dopant diffusion. The band structures and doping levels of the layers 312 and 313 can be selected such that the depletion zone electric field of the junction 315 is greater than the threshold electric field for the avalanche effect for electrons (or for holes) in the materials of the layers 312 and 313, but is not too high to cause self-sustaining avalanche. Namely, the depletion zone electric field of the junction 315 should cause avalanche when there are incident photons in the absorption region 310 but the avalanche should cease without further incident photons in the absorption region 310.

The image sensor 300 may further include electrodes 304 respectively in electrical contact with the layer 313 of the APDs 350. The electrodes 304 are configured to collect electric current flowing through the APDs 350.

The image sensor 300 may further include a passivation material 303 configured to passivate surfaces of the absorption regions 310 and the layer 313 of the APDs 350 to reduce recombination at these surfaces.

The image sensor 300 may further include a heavily doped layer 302 disposed on the absorption regions 310 opposite to the amplification region 320, and a common electrode 301 on the heavily doped layer 302. The common electrode 310 of at least some or all of the APDs 350 may be joined together. The heavily doped layer 302 of at least some or all of the APDs 350 may be joined together.

When a photon incidents on the image sensor 300, it may be absorbed by the absorption region 310 of one of the APDs 350, and charge carriers may be generated in the absorption region 310 as a result. One type (electrons or holes) of the charge carriers drift toward the amplification region 320 of that one APD. When the charge carriers enter the amplification region 320, the avalanche effect occurs and causes amplification of the charge carriers. The amplified charge carriers can be collected through the electrode 304 of that one APD, as an electric current. When that one APD is in the linear mode, the electric current is proportional to the number of incident photons in the absorption region 310 per unit time (i.e., proportional to the light intensity at that one APD). The electric currents at the APDs may be compiled to represent a spatial intensity distribution of light, i.e., an image. The amplified charge carriers may alternatively be collected through the electrode 304 of that one APD, and the number of photons may be determined from the charge carriers (e.g., by using the temporal characteristics of the electric current).

Figure 3B:
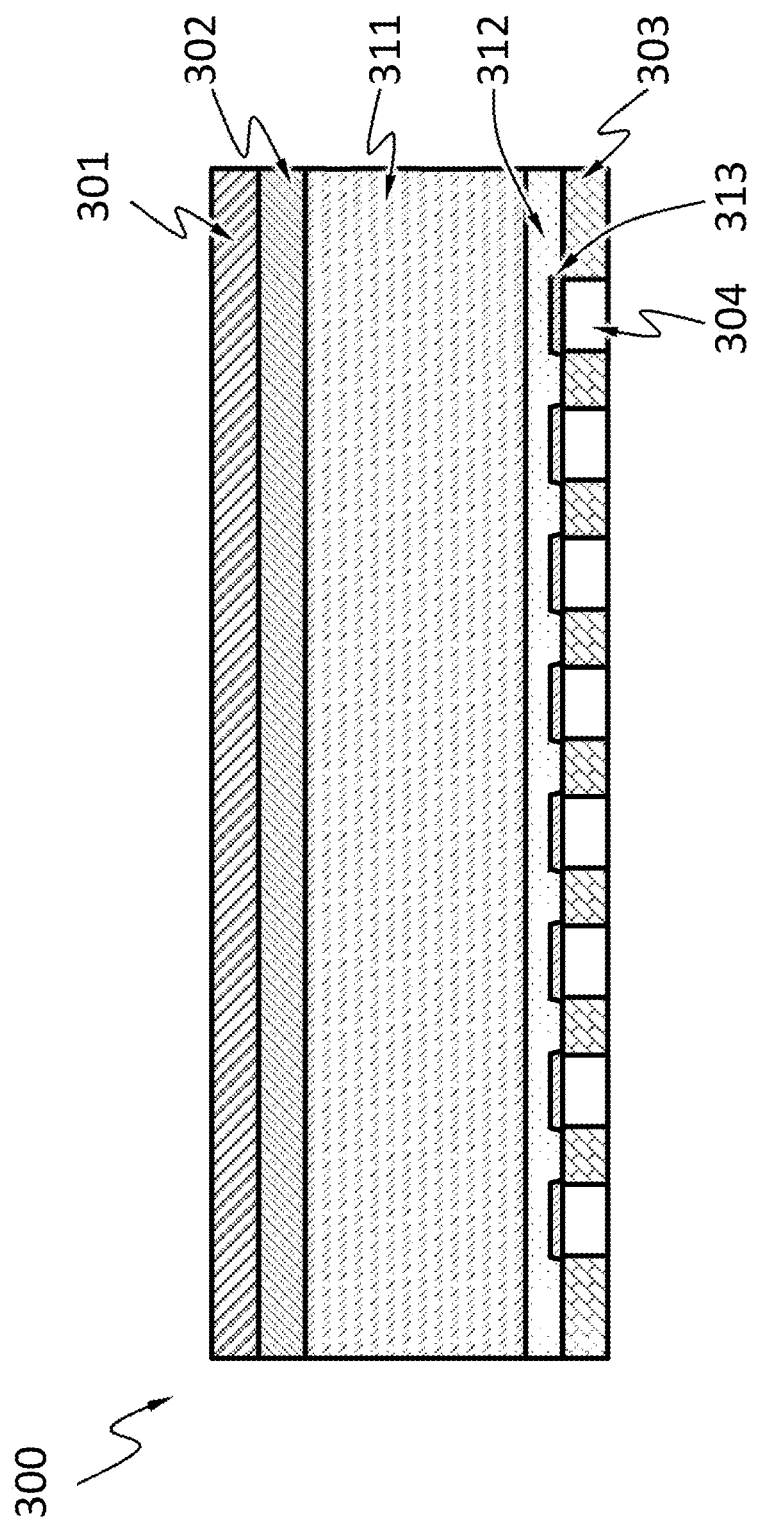
FIG. 3B shows a variant of the image sensor of FIG. 3A.
Figure 3C:
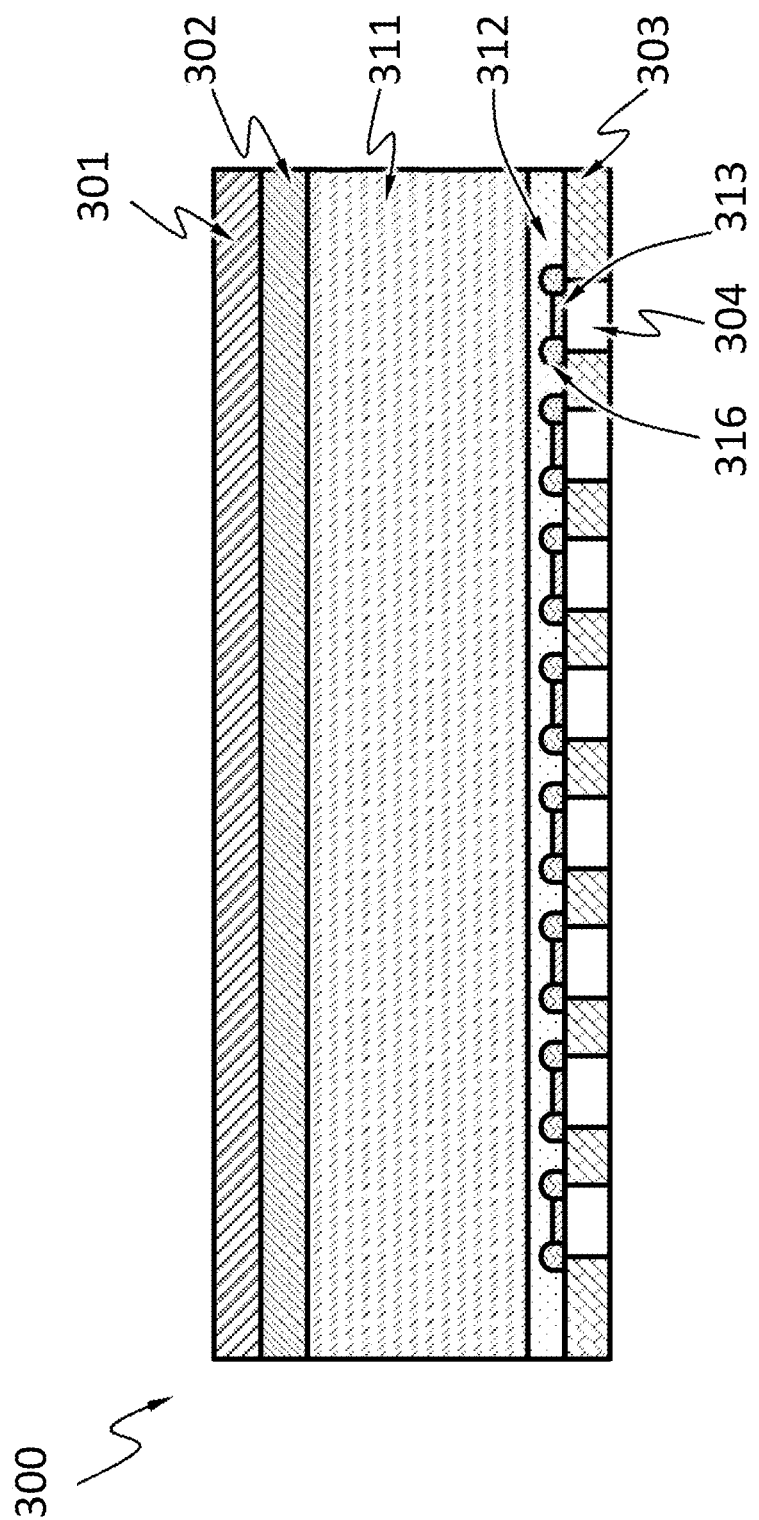
FIG. 3C shows a variant of the image sensor of FIG. 3A.
Figure 3D:
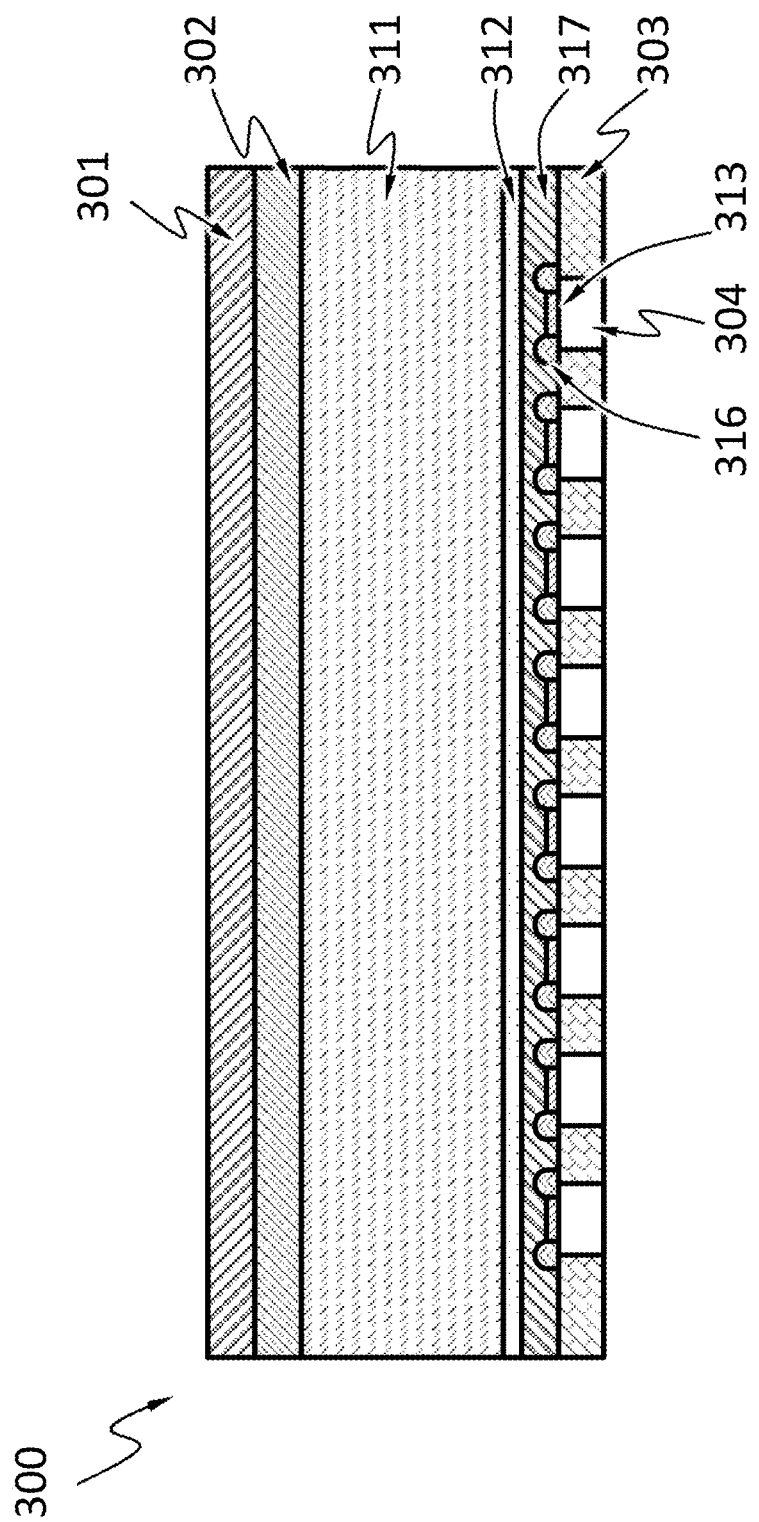
FIG. 3D shows a variant of the image sensor of FIG. 3A.
Figure 4A:
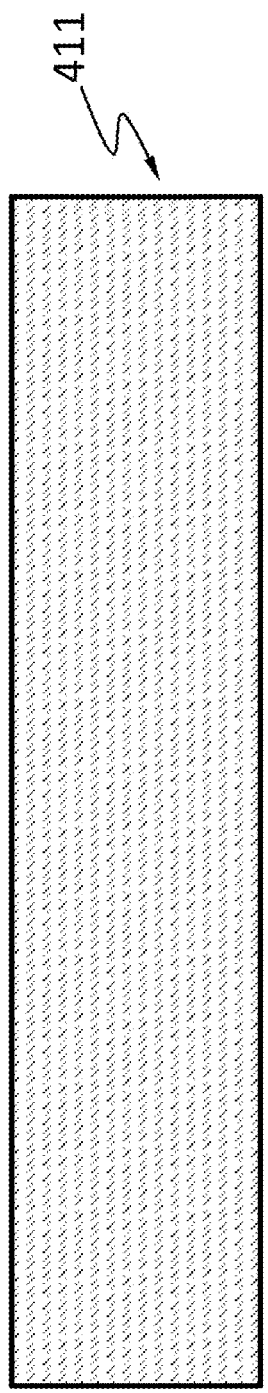
FIG. 4A-FIG. 4G schematically show a method of making the image sensor.
Figure 4B:
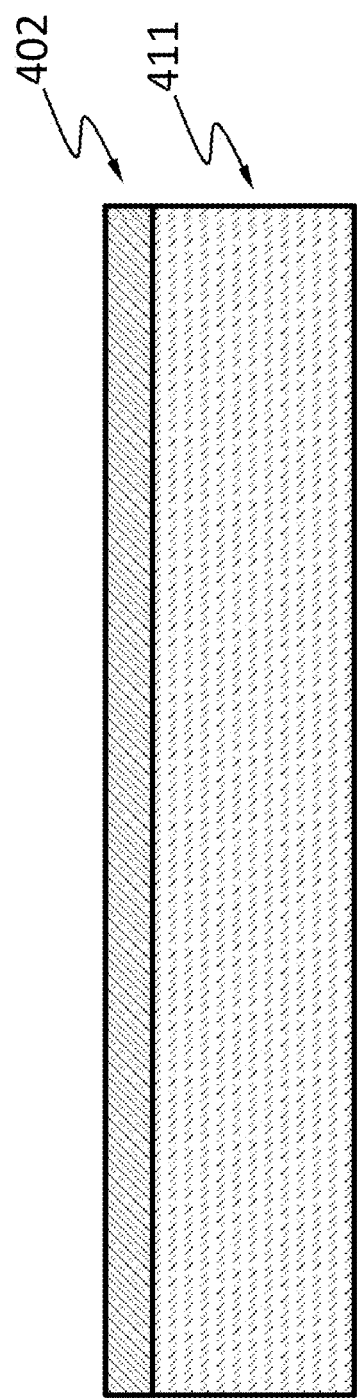
Figure 4C:
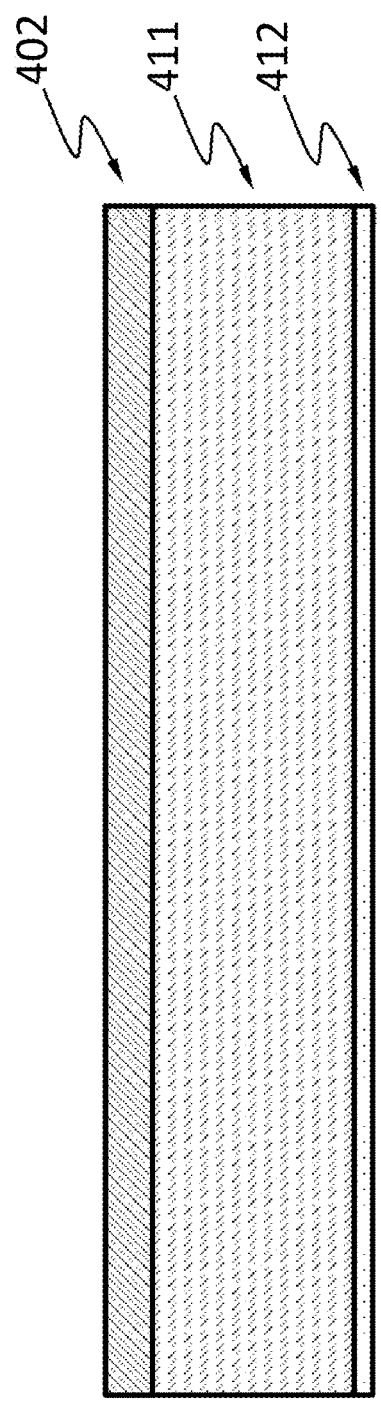
Figure 4D:
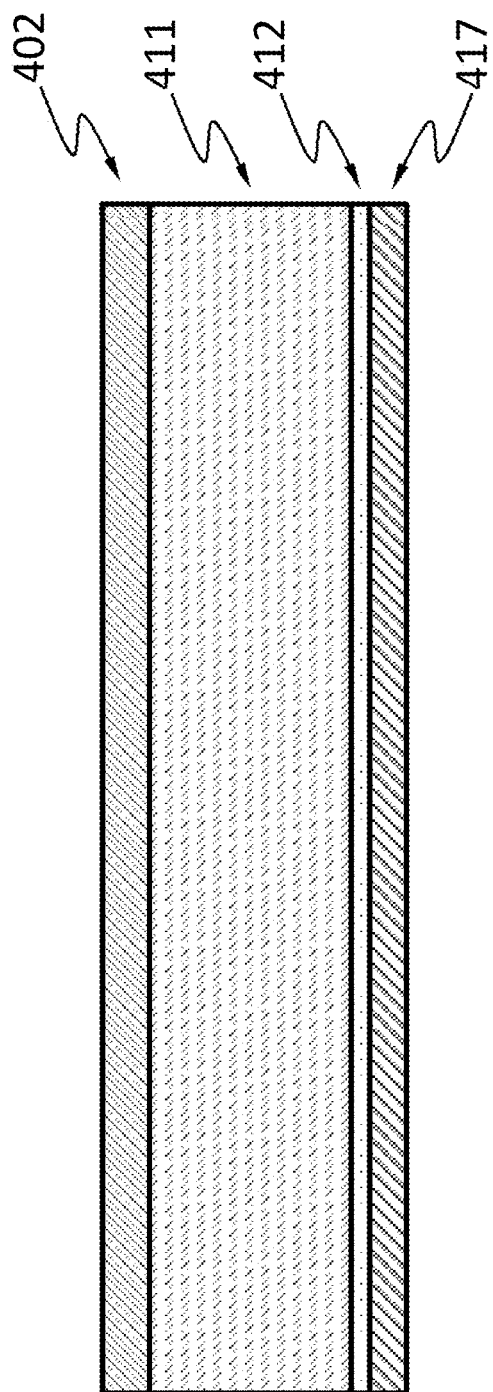
Figure 4E:
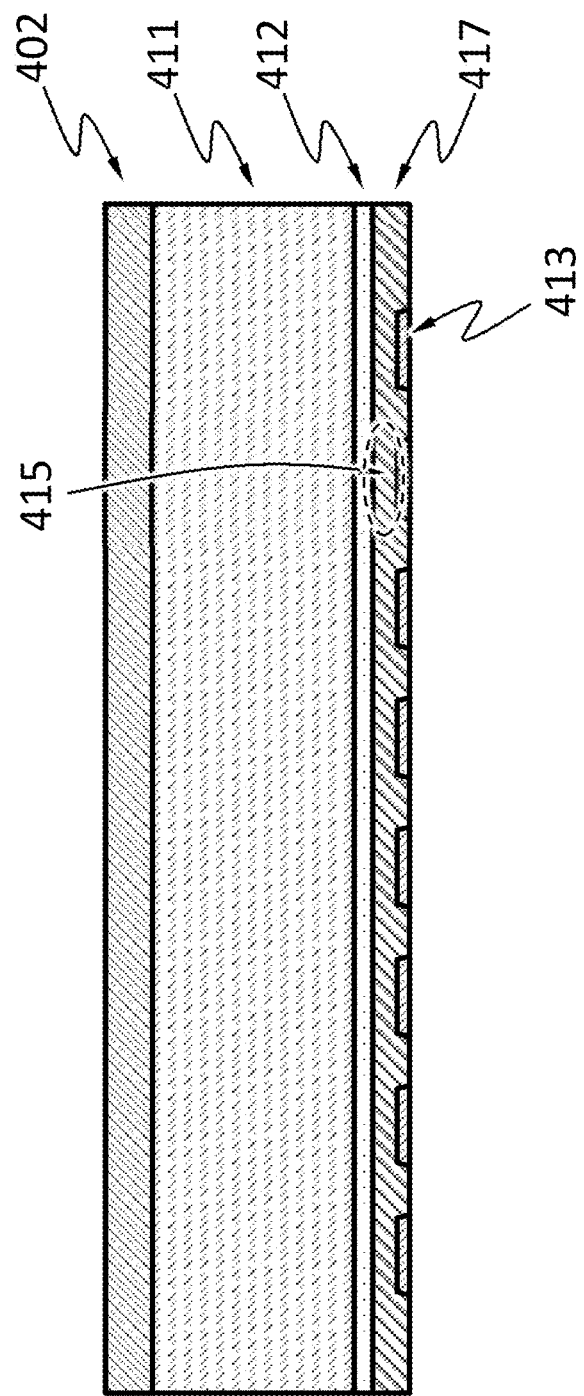
Figure 4F:
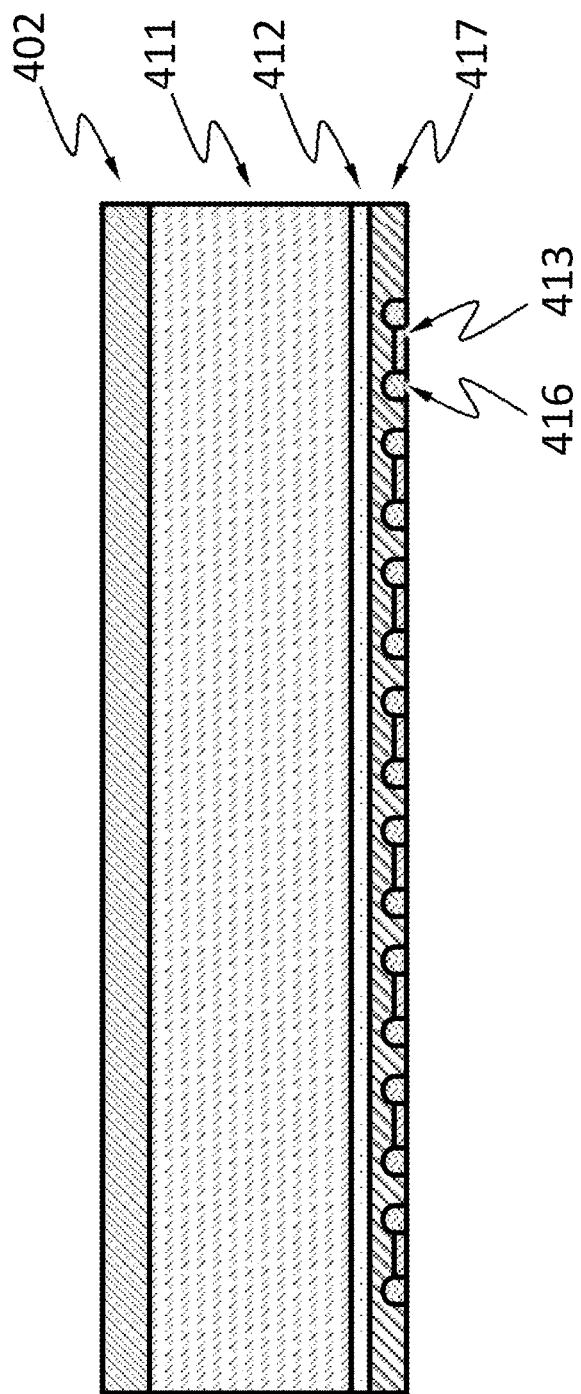
Figure 4G:
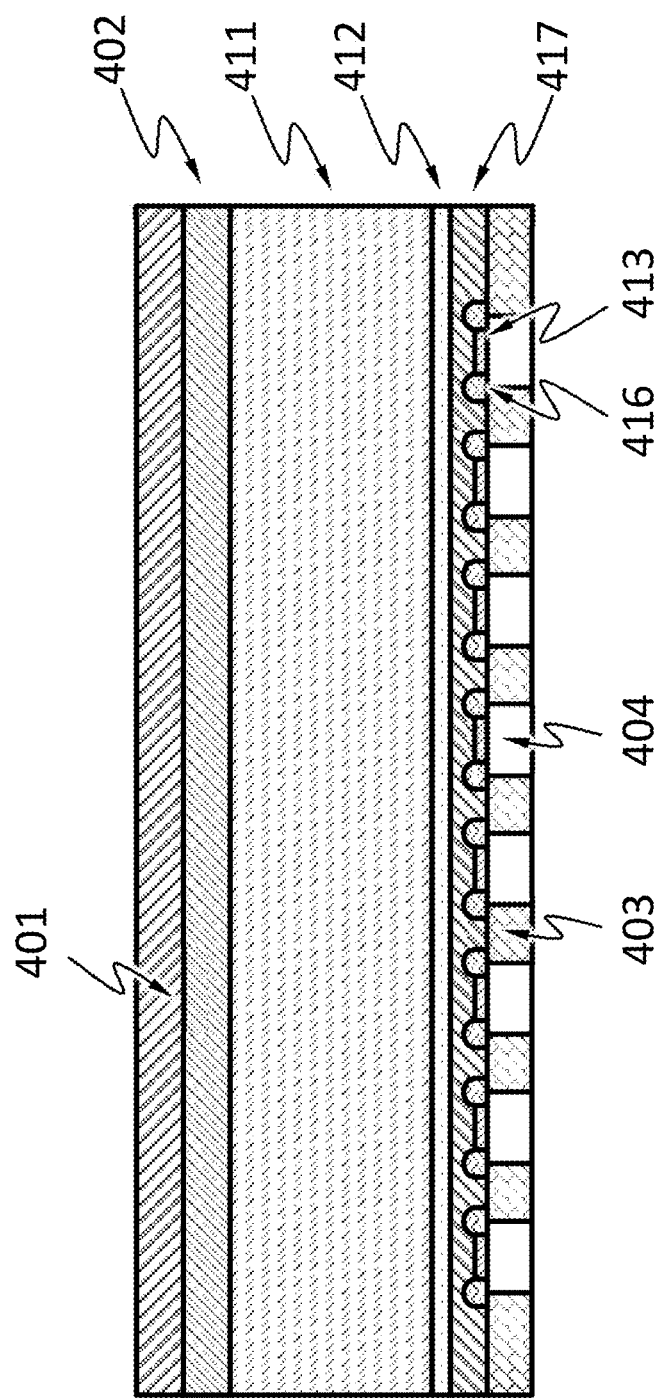

The junctions 315 of the APDs 350 should be discrete, i.e., the junction 315 of one of the APDs should not be joined with the junction 315 of another one of the APDs. Charge carriers amplified at one of the junctions 315 of the APDs 350 should not be shared with another of the junctions 315. The junction 315 of one of the APDs may be separated from the junction 315 of the neighboring APDs by the material of the absorption region wrapping around the junction, by the material of the layer 312 or 313 wrapping around the junction, by an insulator material wrapping around the junction, or by a guard ring of a doped semiconductor. As shown in FIG. 3A, the layer 312 of each of the APDs 350 may be discrete, i.e., not joined with the layer 312 of another one of the APDs; the layer 313 of each of the APDs 350 may be discrete, i.e., not joined with the layer 313 of another one of the APDs. FIG. 3B shows a variant of the image sensor 300, where the layers 312 of some or all of the APDs are joined together. FIG. 3C shows a variant of the image sensor 300, where the junction 315 is surrounded by a guard ring 316. The guard ring 316 may be an insulator material or a doped semiconductor. For example, when the layer 313 is heavily doped n-type semiconductor, the guard ring 316 may be n-type semiconductor of the same material as the layer 313 but not heavily doped. The guard ring 316 may be present in the image sensor 300 shown in FIG. 3A or FIG. 3B. FIG. 3D shows a variant of the image sensor 300, where the junction 315 has an intrinsic semiconductor layer 317 sandwiched between the layer 312 and 313. The intrinsic semiconductor layer 317 in each of the APDs 350 may be discrete, i.e., not joined with other intrinsic semiconductor layer 317 of another APD. The intrinsic semiconductor layers 317 of some or all of the APDs 350 may be joined together.

FIG. 4A-FIG. 4G schematically show a method of making the image sensor 300. The method starts with obtaining a semiconductor substrate 411. The semiconductor substrate 411 may be a silicon substrate. The semiconductor substrate 411 is an intrinsic semiconductor or very lightly doped semiconductor (e.g., $<10^{12}$ dopants/cm$^3$, $<10^{11}$ dopants/cm$^3$, $<10^{10}$ dopants/cm$^3$, $<10^9$ dopants/cm$^3$), with a sufficient thickness and thus a sufficient absorptance (e.g., >80% or >90%) for incident photons of interest (e.g., X-ray photons). A heavily doped layer 402 is formed on one side of the semiconductor substrate 411. The heavily doped layer 402 (e.g., heavily doped p-type layer) may be formed for diffusing or implanting a suitable dopant into the substrate 411. A doped layer 412 is formed on the side of the semiconductor substrate 411 opposite to the heavily doped layer 402. The layer 412 may have a doping level of $10^{13}$ to $10^{17}$ dopants/cm$^3$. The layer 412 may be the same (i.e., the layer 412 is p-type if the layer 402 is p-type and the layer 412 is n-type if the layer 402 is n-type) doping type as the heavily doped layer 402. The layer 412 may be formed by diffusing or implanting a suitable dopant into the substrate 411 or by epitaxy growth. The layer 412 may be a continuous layer or may have discrete areas. An optional layer 417 may be formed on the layer 412. The layer 417 may be completely separated from the material of the substrate 411 by the layer 412. Namely, if the layer 412 has discrete regions, the layer 417 has discrete regions. The layer 417 is an intrinsic semiconductor. The layer 417 may be formed by epitaxy growth. A layer 313 is formed on the layer 417 if it is present, or on the layer 412 if the layer 417 is not present. The layer 412 may be completely separated from the material of the substrate 411 by the layer 412 or the layer 417. The layer 413 may have discrete areas. The layer 413 is a heavily doped semiconductor having the opposite (i.e., the layer 413 is n-type if the layer 412 is p-type; the layer 413 is p-type if the layer 412 is n-type) type of dopant as the layer 412. The layer 413 may have a doping level of $10^{18}$ dopants/cm$^3$ or above. The layer 413 may be formed by diffusing or implanting a suitable dopant into the substrate 411 or by epitaxy growth. The layer 413, the layer 412, and the layer 417 if present, form discrete junctions 415 (e.g., p-n junctions, p-i-n junctions, heterojunctions). Optional guard rings 416 may be formed around the junctions 415. The guard ring 416 may be a semiconductor of the same doping type as the layer 413 but not heavily doped. A passivation material 403 may be applied to passivate surfaces of the substrate 411, the layers 412 and 413. Electrodes 404 may be formed and electrically connected to the junctions 415 through the layer 413. A common electrode 401 may be formed on the heavily doped layer 402 for electrical connection thereto.

Figure 5:
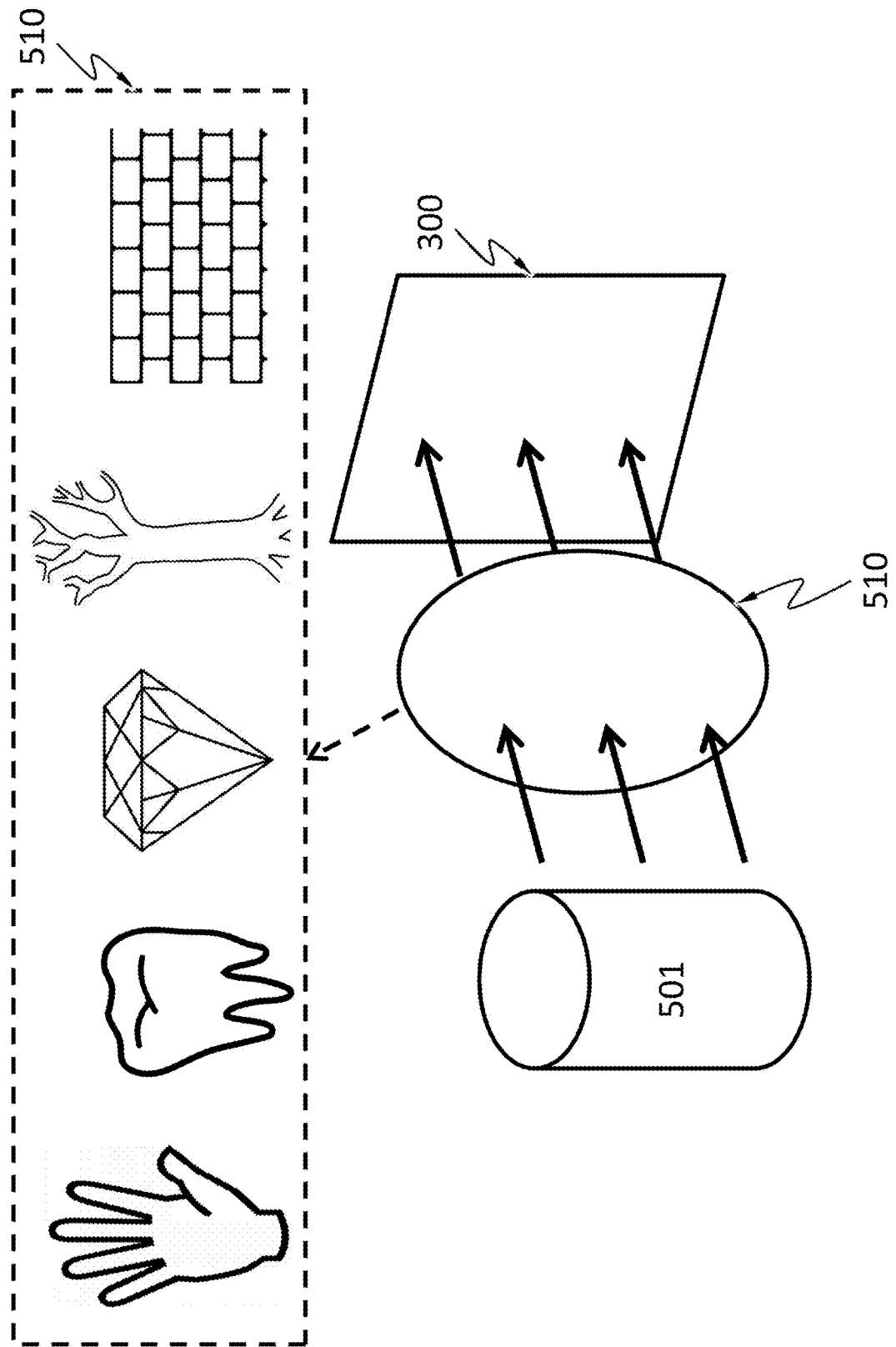
FIG. 5 schematically shows a system comprising the image sensor described herein.

FIG. 5 schematically shows a system comprising the image sensor 300 described herein. The system comprises an X-ray source 501. X-ray emitted from the X-ray source 501 penetrates an object 510 (e.g., diamonds, tissue samples, a human body part such as breast), is attenuated by different degrees by the internal structures of the object 510, and is projected to the image sensor 300. The image sensor 300 forms an image by detecting the intensity distribution of the X-ray. The system may be used for medical imaging such as chest X-ray radiography, abdominal X-ray radiography, dental X-ray radiography, mammography, etc. The system may be used for industrial CT, such as diamond defect detection, scanning a tree to visualize year periodicity and cell structure, scanning building material like concrete after loading, etc.

Figure 6:
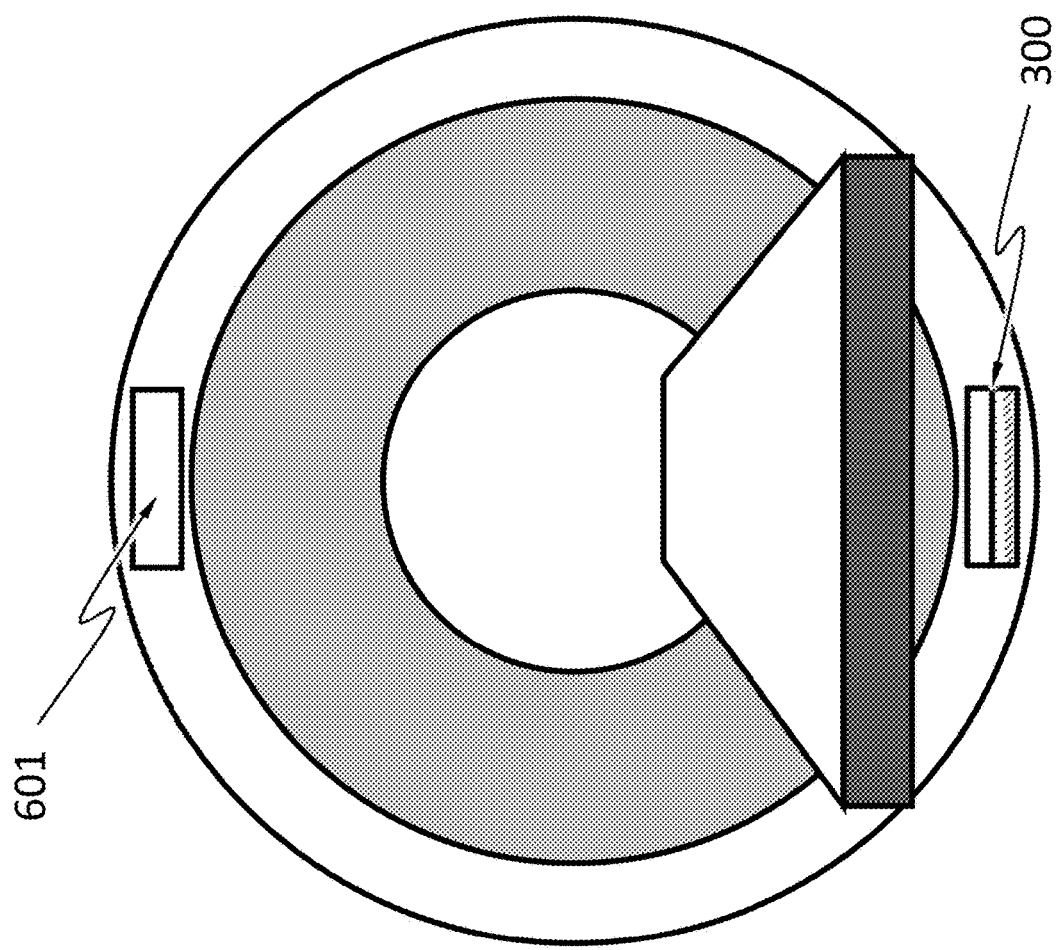
FIG. 6 schematically shows an X-ray computed tomography (X-ray CT) system.

FIG. 6 schematically shows an X-ray computed tomography (X-ray CT) system. The X-ray CT system uses computer-processed X-rays to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The X-ray CT system comprises the image sensor 300 described herein and an X-ray source 601. The image sensor 300 and the X-ray source 601 may be configured to rotate synchronously along one or more circular or spiral paths.

Figure 7:
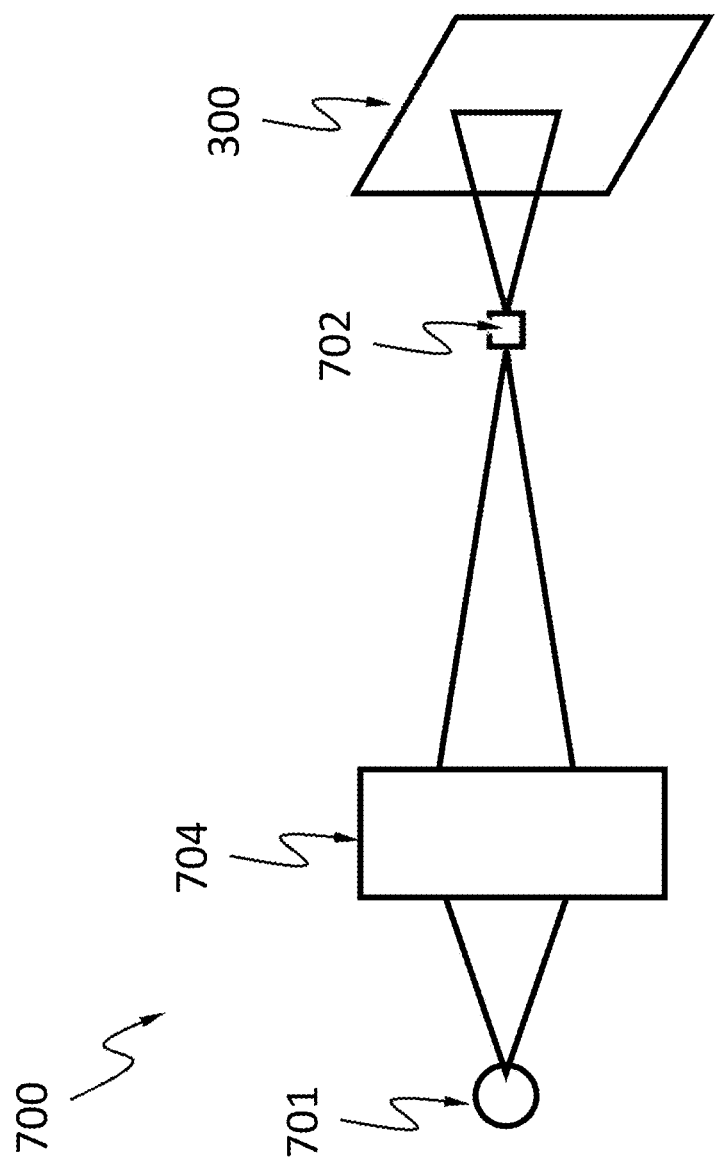
FIG. 7 schematically shows an X-ray microscope.

FIG. 7 schematically shows an X-ray microscope or X-ray micro CT 700. The X-ray microscope or X-ray micro CT 700 may include an X-ray source 701, focusing optics 704, and the image sensor 300 described herein, for detecting an X-ray image of a sample 702.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus comprising:
   an array of avalanche photodiodes (APDs), each of the APDs comprising an absorption region and an amplification region;
   wherein the absorption region is configured to generate charge carriers from a photon absorbed by the absorption region;
   wherein the amplification region comprises a junction with an electric field in the junction;
   wherein the electric field is at a value sufficient to cause an avalanche of charge carriers entering the amplification region, but not sufficient to make the avalanche self-sustaining;
   wherein the junctions of the APDs are discrete.

2. The apparatus of claim 1, wherein the photon is a soft X-ray photon.

3. The apparatus of claim 1, wherein the absorption region has an absorptance of at least 80% for soft X-ray.

4. The apparatus of claim 1, wherein the absorption region has a thickness of 10 microns or above.

5. The apparatus of claim 1, wherein the absorption region comprises silicon.

6. The apparatus of claim 1, wherein an electric field in the absorption region is not high enough to cause avalanche effect in the absorption region.

7. The apparatus of claim 1, wherein the absorption region is an intrinsic semiconductor or a semiconductor with a doping level less than $10^{12}$ dopants/cm$^3$.

8. The apparatus of claim 1, wherein the absorption regions of at least some of the APDs are joined together.

9. The apparatus of claim 1, comprising two amplification regions on opposite sides of the absorption region.

10. The apparatus of claim 1, wherein the amplification regions of the APDs are discrete.

11. The apparatus of claim 1, wherein the junction is a p-n junction or a heterojunction.

12. The apparatus of claim 1, wherein the junction comprises a first layer and a second layer, wherein the first layer is a doped semiconductor and the second layer is a heavily doped semiconductor.

13. The apparatus of claim 12, wherein the first layer has a doping level of $10^{13}$ to $10^{17}$ dopants/cm$^3$.

14. The apparatus of claim 12, wherein the first layers of least some of the APDs are joined together.

15. The apparatus of claim 12, further comprising electrodes respectively in electrical contact with the second layers of the APDs.

16. The apparatus of claim 1, further comprising a passivation material configured to passivate a surface of the absorption region.

17. The apparatus of claim 1, further comprising a common electrode electrically connected to the absorption region.

18. The apparatus of claim 1, wherein the junction is separated from a junction of a neighbor junction by a material of the absorption region, a material of the first or second layer, an insulator material, or a guard ring of a doped semiconductor.

19. The apparatus of claim 18, wherein the guard ring is a doped semiconductor of a same doping type as the second layer and the guard ring is not heavily doped.

20. The apparatus of claim 12, wherein the junction further comprises a third layer sandwiched between the first and second layers; wherein the third layer comprises an intrinsic semiconductor.

21. The apparatus of claim 20, wherein the third layers of at least some of the APDs are joined together.

22. A system comprising the apparatus of claim 1 and an X-ray source, wherein the system is configured such that the apparatus of claim 1 forms an image of an object using X-ray from the X-ray source that penetrated the object.

23. The system of claim 22, wherein the system is configured to conduct chest X-ray radiography, abdominal X-ray radiography, dental X-ray radiography, or mammography.

24. The system of claim 22, wherein the system is configured to conduct computation computed tomography.

25. The system of claim 22, wherein the system is a microscope.

* * * * *